(12) United States Patent  
Julson et al.

(10) Patent No.: US 8,914,961 B2  
(45) Date of Patent: Dec. 23, 2014

(54) METHODS AND SYSTEMS FOR MEASURING CRIMP QUALITY

(75) Inventors: Timothy D. Julson, Rochester Hills, MI (US); Gary W. Taraski, Oxford, MI (US); Khara D. Pratt, Redford, MI (US); Kimberley R. Will, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 352 days.

(21) Appl. No.: 13/456,123

(22) Filed: Apr. 25, 2012

(65) Prior Publication Data

US 2013/0219680 A1    Aug. 29, 2013

Related U.S. Application Data

(60) Provisional application No. 61/605,034, filed on Feb. 29, 2012, provisional application No. 61/605,037, filed on Feb. 29, 2012.

(51) Int. Cl.
*G01R 31/11*    (2006.01)

(52) U.S. Cl.
USPC ......... 29/407.05; 29/407.01; 29/705; 29/593; 324/538; 700/110

(58) Field of Classification Search
CPC ...... G01R 31/28; G01R 31/282; G01R 31/11; G01R 31/08; G01R 31/022
USPC ......... 29/407.01, 407.05, 407.1, 407.04, 705, 29/593, 861; 324/538
See application file for complete search history.

(56) References Cited

U.S. PATENT DOCUMENTS

| | | | | |
|---|---|---|---|---|
| 3,335,365 A | * | 8/1967 | Libhart | 324/718 |
| 3,711,942 A | | 1/1973 | Reynolds | |
| 4,110,880 A | * | 9/1978 | Peppler et al. | 29/33 K |
| 4,641,428 A | * | 2/1987 | Anderson | 29/863 |
| 4,903,403 A | * | 2/1990 | Brown et al. | 29/861 |
| 5,072,185 A | * | 12/1991 | Rockwell | 324/539 |
| 5,589,776 A | * | 12/1996 | Morant | 324/534 |
| 5,635,894 A | * | 6/1997 | Morant | 338/328 |
| 6,035,517 A | * | 3/2000 | Moore et al. | 29/564.4 |
| 6,418,769 B1 | * | 7/2002 | Schreiner | 72/21.4 |
| 6,538,452 B2 | * | 3/2003 | Madsen et al. | 324/538 |
| 6,650,956 B2 | * | 11/2003 | Takada et al. | 700/110 |

(Continued)

OTHER PUBLICATIONS

Kularatna, Nihal (2003). Digital and Analogue Instrumentation—Testing and Measurement. Institution of Engineering and Technology. Online version available at: http://app.knovel.com/hotlink/toc/id:kpDAITM001/digital-analogue-instrumentation.*

(Continued)

*Primary Examiner* — David Bryant
*Assistant Examiner* — Jason L Vaughan
(74) *Attorney, Agent, or Firm* — Ingrassia Fisher & Lorenz, P.C.

(57) ABSTRACT

A method is provided for evaluating a crimp procedure in a manufacturing process. In one embodiment, the method includes, but is not limited to, completing a crimp procedure on a single wire. The method further includes, but is not limited to, evaluating a quality of the crimp procedure based on time-domain reflectometry. The method still further includes, but is not limited to, generating reporting data based on the evaluating.

16 Claims, 3 Drawing Sheets

(56) References Cited

U.S. PATENT DOCUMENTS

| | | | |
|---|---|---|---|
| 7,120,563 B2 * | 10/2006 | Bechhoefer et al. | 702/189 |
| 7,139,668 B2 * | 11/2006 | Bechhoefer | 702/58 |
| 7,181,942 B2 * | 2/2007 | Yost et al. | 72/17.2 |
| 7,512,503 B2 * | 3/2009 | Bechhoefer et al. | 702/58 |
| 8,671,551 B2 * | 3/2014 | Yost et al. | 29/593 |
| 2007/0001683 A1 | 1/2007 | Krigel | |

OTHER PUBLICATIONS

The German Patent and Trade Mark Office, Office Action for German Patent Application No. 10 2013 201 907.6, dated Oct. 23, 2013.

* cited by examiner

METHODS AND SYSTEMS FOR MEASURING CRIMP QUALITY

CROSS REFERENCE TO RELATED APPLICATIONS

This application claims the benefit of U.S. Provisional Application No. 61/605,034, filed Feb. 29, 2012, and U.S. Provisional Application No. 61/605,037, filed Feb. 29, 2012 which are herein incorporated by reference in their entirety.

TECHNICAL FIELD

The technical field generally relates to quality measurement systems and methods, and more particularly relates to quality measurement systems and methods for a wire terminal crimp process.

BACKGROUND

Crimping technology was developed to replace a need to solder wire terminations. The methods for applying crimp terminations depend on the application and volume. For example, the application methods include the use of a hand tool, a press and die set, a stripper crimper, or a fully automatic wire processing system. In each of the methods, a proper configuration of the tool is needed for a quality crimp.

The quality of the crimp can be evaluated indirectly by monitoring the force applied during the crimp process (also referred to as crimp force monitoring (CFM)). CFM captures the force signature of a crimping press and compares it to a previously recorded signature. This method of monitoring allows for undetected wear to remain undetected. These inherent flaws associated with CFM result in passing bad crimps on to assembly.

Accordingly, it is desirable to provide methods and systems for providing a direct method of evaluating the quality of the crimp. In addition, it is desirable to provide the methods and systems for use in a wire manufacturing process so that the tool can be properly configured when an error exists and thus preventing bad crimps from being passed on to assembly. Furthermore, other desirable features and characteristics of the present invention will become apparent from the subsequent detailed description and the appended claims, taken in conjunction with the accompanying drawings and the foregoing technical field and background.

SUMMARY

A method is provided for evaluating a crimp procedure in a manufacturing process. In one embodiment, the method includes, but is not limited to, completing a crimp procedure on a single wire. The method further includes, but is not limited to, evaluating a quality of the crimp procedure based on time-domain reflectometry. The method still further includes, but is not limited to, generating reporting data based on the evaluating.

A system is provided for evaluating a crimp procedure of a wire in a manufacturing process. In one embodiment, the system includes a crimp apparatus, and a crimp quality measurement module. The crimp quality measurement module evaluates a quality of a crimp procedure performed on a single wire by the crimp apparatus, and generates reporting data based on the evaluation, wherein the evaluation is based on time-domain reflectometry.

DESCRIPTION OF THE DRAWINGS

The present disclosure will hereinafter be described in conjunction with the following drawing figures, wherein like numerals denote like elements, and wherein.

DETAILED DESCRIPTION

Figure 1:
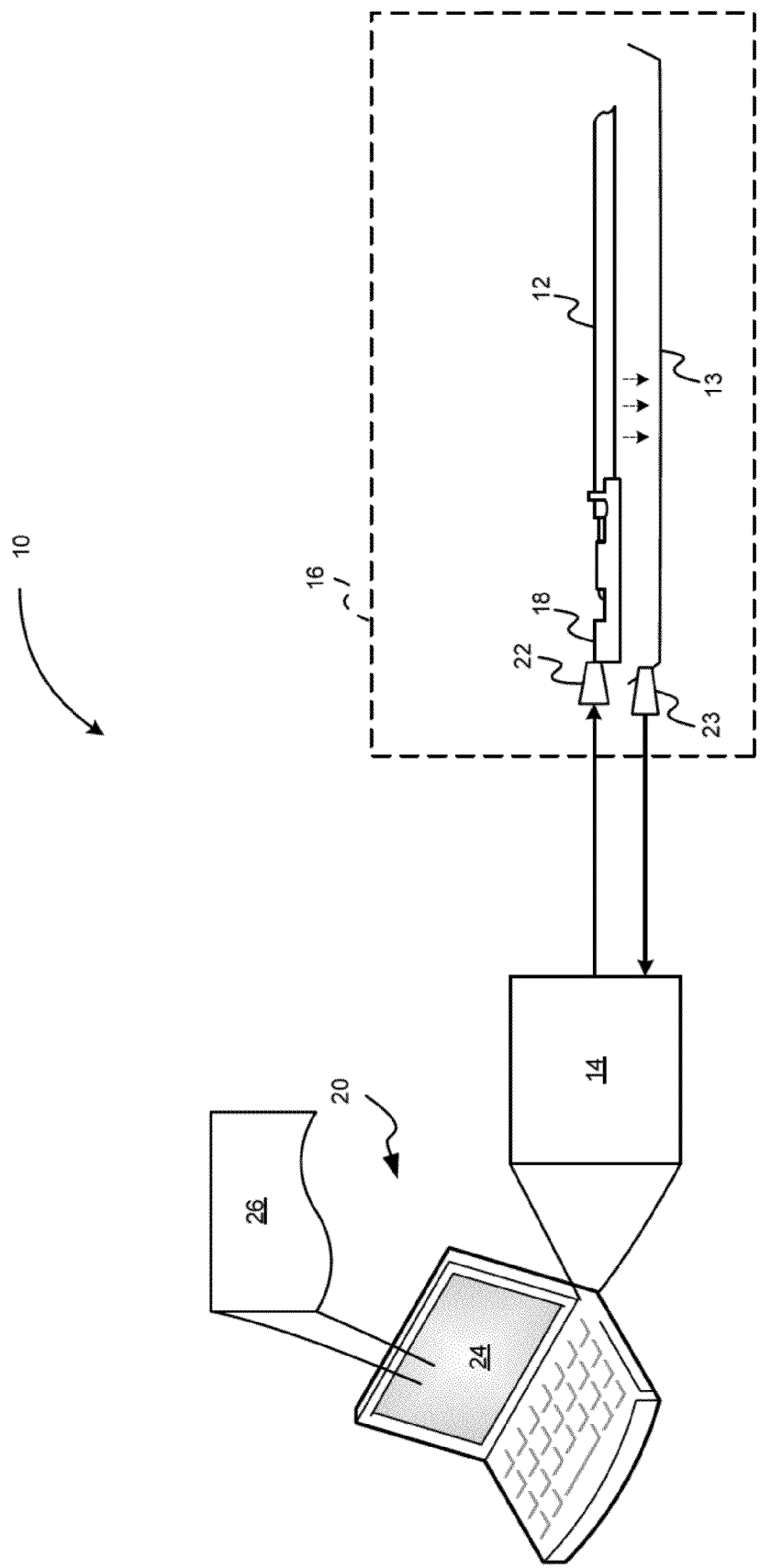
FIG. 1 is a block diagram illustrating a crimp quality measurement system in accordance with exemplary embodiments.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

It should be understood that throughout the drawings, corresponding reference numerals indicate like or corresponding parts and features. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

FIG. 1 is a block diagram of a crimp quality measurement system 10 in accordance with exemplary embodiments of the present disclosure. The crimp quality measurement system 10 is used in a wire manufacture process to directly evaluate the quality of the crimp procedure performed on a wire 12. The crimp quality measurement system 10 includes a crimp quality measurement module 14 that is associated with a crimping apparatus 16. The crimping apparatus 16 applies a crimp termination 18 to the wire 12. The crimping apparatus 16 may include any device, from a hand-held device to a fully automated system (e.g., a basic hand tool, a press and die set, a stripper crimper, a fully automatic wire processing machine).

Once the crimp procedure is complete for a single wire, the crimp quality measurement module 14 uses time-domain reflectometry (TDR) to measure the quality of the crimp procedure. The crimp quality measurement module 14 may be integrated with the crimp apparatus 16 or, alternatively, may be implemented as a stand-alone application that resides on or is associated with a computing device 20 (as shown). Such computing device 20 may include, but is not limited to, a laptop, a desktop computer, a workstation, a server, a handheld device.

Generally speaking, the crimp quality measurement module 14 contacts the wire terminal end 12 and a wire tray 12 (e.g., via one or more connectors 22, 23). The wire 12 may be placed on the wire tray 12 during or after the crimp procedure and rests on the wire tray 12 during the crimp quality measurement process performed by the crimp quality measurement module 14. The wire tray 13 may be a stand-alone tray or may be a tray that is integrated with the crimping apparatus 16. The wire tray 13 is configured such that it provides a desired signal return path. The desired signal return path is based on an impedance characteristic of the wire 12.

The crimp quality measurement module 14 uses TDR, for example, to generate test pulses along the wire 12, to receive reflected test pulses from the wire tray 13, to determine an impedance from the reflected test pulses, and to evaluate the quality based on the impedance. Based on the evaluation, the crimp quality measurement module 14 provides an immediate indication of whether the crimp procedure performed on the particular wire meets and expected level of quality. The indication may be provided on a display 24 of the computing device 20 in the form of a quality report 26.

In various embodiments, if the crimp procedure does not meet an expected level of quality, the crimp quality measurement module 14 can determine whether the fault is with respect to the crimp termination 18 or the wire 12 and can provide an indication of a location of the poor quality with respect to the wire 12. The indication can be a graphical illustration of the location with respect to the wire 12 and/or can be a textual description of the location with respect to the wire 12.

Figure 2:
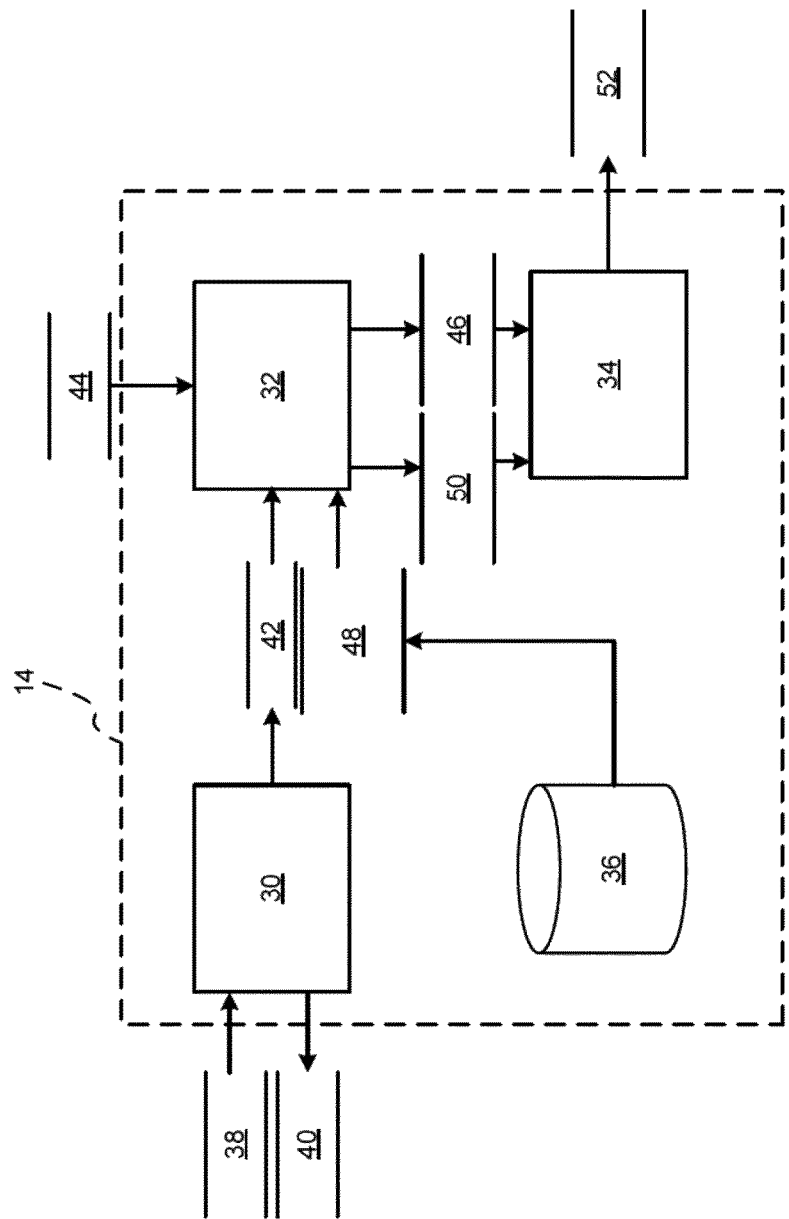
FIG. 2 is a dataflow diagram illustrating a crimp quality measurement module of the crimp quality measurement system in accordance with exemplary embodiments.

Referring now to FIG. 2, a dataflow diagram illustrates various embodiments of a crimp quality measurement module 14 of the crimp quality measurement system 10 (FIG. 1). Various embodiments of crimp quality measurement systems 10 according to the present disclosure may include any number of sub-modules embedded within the crimp quality measurement module 14. As can be appreciated, the sub-modules shown in FIG. 2 may be combined and/or further partitioned to similarly evaluate the quality of a crimp procedure performed on the wire 12 (FIG. 1). Inputs to the system may be sensed from the wire 12, received from other modules (not shown), and/or determined/modeled by other sub-modules (not shown) within the crimp quality measurement module 14. In various embodiments, the crimp quality measurement module 14 includes a pulse generator module 30, a pulse evaluation module 32, a reporting module 34, and an expected data datastore 36.

The pulse generator module 30 receives as input a test request 38. The test request 38 can include data indicating that an evaluation of the crimp procedure is requested. The test request 38 may be initiated, for example, by a user interacting with the computing device 20 (FIG. 1) after the crimp procedure has been performed, or automatically by the computing device 20 (FIG. 1) or crimp apparatus 16 (FIG. 1) at a scheduled event during the wire manufacturing process.

Based on the test request 38, the pulse generator module 30 initiates the evaluation of the crimp procedure by initiating the generation of or generating one or more test pulses 40 along the wire 12 (FIG. 1). The test pulses 40 may be initiated/generated based on a wire type and a terminal type. The wire type and the terminal type may be configured by a user for the particular crimp configuration or may be stored in a crimp configuration datastore (not shown) and retrieved from the datastore for the particular crimp configuration.

The pulse generator module 30 stores pulse data based on the test pulses 40. For example, the pulse data 42 may include but is not limited to, a pulse voltage, a time between pulses, and a pulse duration.

The pulse evaluation module 32 receives as input the pulse data 42, and one or more reflected pulses 44. The reflected pulses 44 are based on the generated test pulses 40 and are received from the wire tray 13 (FIG. 1). The pulse evaluation module 32 evaluates an impedance variation of the reflected pulses 44 to determine an impedance status 46. For example, the pulse evaluation module 32 compares the actual impedance variation with an expected impedance variation. If the actual impedance variation is within a range of the expected impedance variation, the pulse evaluation module 32 sets the impedance status 46 to indicate no fault (e.g., set it to FALSE or zero). If the actual impedance variation is outside of the range of the expected impedance variation, the pulse evaluation module 32 sets the impedance status 46 to indicate a fault (e.g., to TRUE or one). The expected impedance variation data 48 can be retrieved from the expected data datastore 36 that is preconfigured with the data based on tests performed on wires that have received a quality crimp.

In various embodiments, when the impedance status 46 is set to indicate a fault, the pulse evaluation module 32 determines whether the fault is a crimp fault or a wire fault. For example, the pulse evaluation module 32 evaluates an impedance magnitude with respect to time. If the impedance magnitude is outside of a first predefined range (generally a small range) within a time period (e.g., an initial portion of the test), then the fault is a crimp fault. If the impedance magnitude is outside of a second predefined range (generally a larger range) within a second time period (e.g. a latter portion of the test), then the fault is a wire fault.

If the fault is a wire fault, the distance 50 to the fault can be computed by monitoring the time at which the reflected pulse 44 is received with respect to the generated test pulse 40 and the voltage of the received reflected pulse 44. For example, the distance (D) 50 can be computed based on the following equation:

$$D=T/2*NVPc, \quad (1)$$

where T is the total or round trip time, NVP is the nominal velocity propagation, and c is the speed of light. Thus, if a ten meter wire was tested, and a fault occurred at five meters, the fault impedance would return a fifty nanosecond time for distance.

The crimp quality reporting module 34 receives as input the distance 50 and the impedance status 46. Based on the inputs, the crimp quality reporting module 64 generates reporting data 52 that may be displayed on the display 24 (FIG. 1) of the computing device 20 (FIG. 1) and or output as a data file. The reporting data 52 may be generated to represent the fault status graphically and/or textually on the display 24 (FIG. 1).

Figure 3:
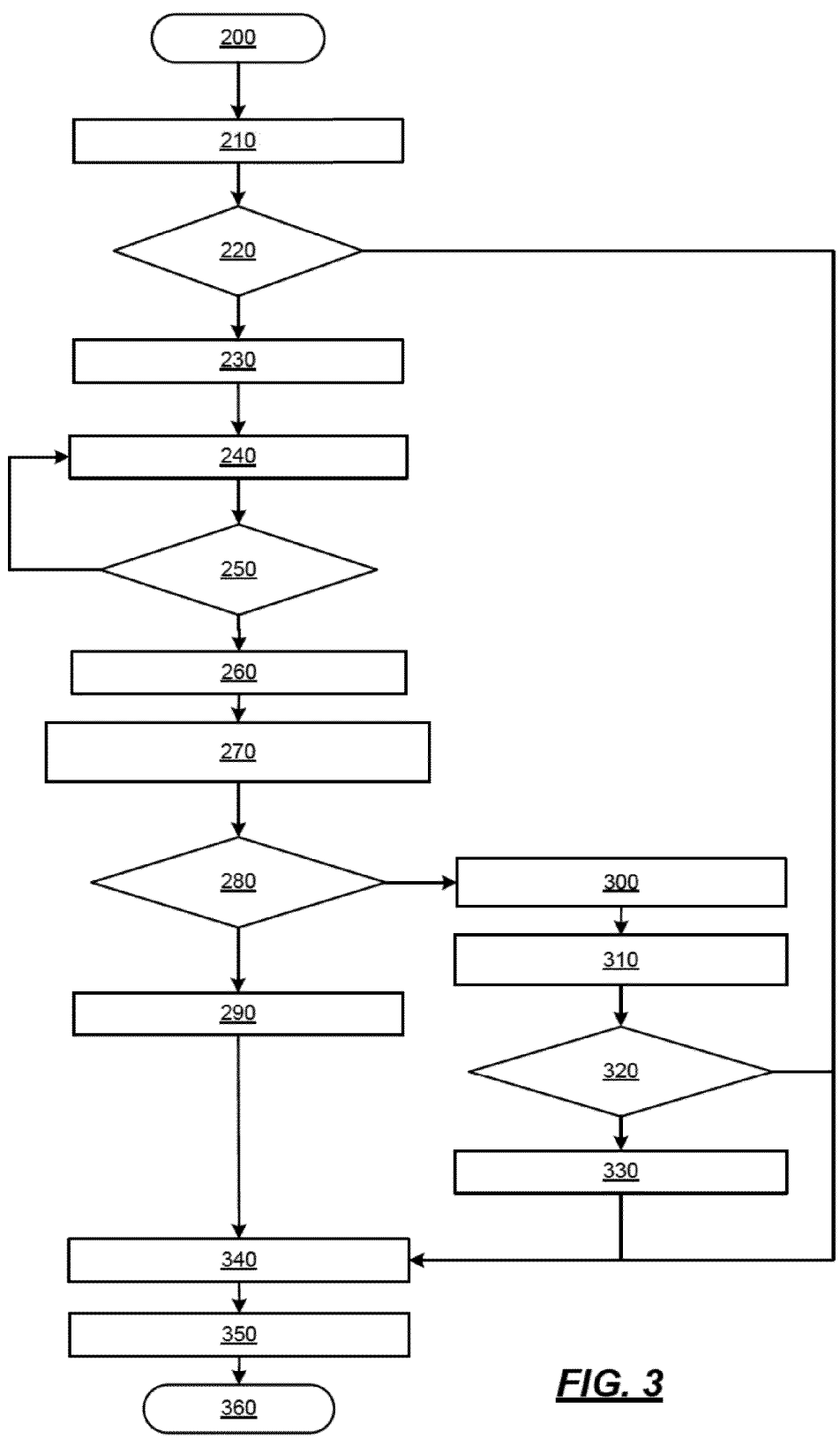
FIG. 3 is a flowchart illustrating a crimp quality measurement method that may be performed by the crimp quality measurement system in accordance with exemplary embodiments.

Referring now to FIG. 3, and with continued reference to FIGS. 1 and 2, a flowchart illustrates a crimp quality measurement method in accordance with the present disclosure. As can be appreciated in light of the disclosure, the order of operation within the method is not limited to the sequential execution as illustrated in FIG. 3, but may be performed in one or more varying orders as applicable and in accordance with the present disclosure.

In one example, the method may begin at 200. The crimp procedure is completed at 210. It is determined whether crimp evaluation has been initiated at 220 (e.g., based on a request by a user initiated via user input, automatically based on a next step in a manufacturing process, etc.). If crimp evaluation has not been initiated at 220, the method may end at 340. If, however, crimp evaluation has been initiated at 220, one or more test pulses are generated at 230.

At 240, the wire 12 is monitored for reflected pulses 44. If reflected pulses 44 are not received at 250, the method continues at 240 by monitoring for the reflected pulses 44. If, however, the reflected pulses 44 are received at 250, the impedance is determined based on the reflected pulses at 260; and the expected impedance is determined for the particular wire and/or crimp configuration at 270. The variation of the impedance of the reflected pulses 44 is evaluated at 280. If the variation is within a range of an expected impedance at 280, the impedance status 46 is set to indicate no fault at 290. The reporting data 52 is generated that includes the impedance status 46 at 340. The reporting data 52 is displayed on the display 24 at 350. Thereafter, the method may end at 360.

If, however, the variation is outside of the range of the expected impedance at 280, the impedance status 46 is set to indicate a fault at 300, and it is determined whether the fault is a wire fault or a terminal fault at 310. If the fault is a wire fault at 320, the distance 50 to the fault is determined at 330. The reporting data 52 is generated that includes the impedance status 46 and/or the distance 50 at 340. The reporting data 52 is displayed on the display 24 at 350. Thereafter, the method may end at 360.

If, however, the fault is not a wire fault at 320, the distance is not computed, rather the reporting data 52 is generated that includes the impedance status 46 at 340. The reporting data 52 is displayed on the display 24 at 350. Thereafter, the method may end at 360.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method of evaluating a crimp procedure in a manufacturing process, the method comprising:
    completing a crimp procedure on a single wire;
    evaluating a quality of the crimp procedure based on time-domain reflectometry; and
    generating reporting data based on the evaluating, wherein the evaluating comprises
      generating test pulses;
      receiving reflected test pulses through a connector connected to a wire tray that holds the single wire; and
      evaluating the reflected pulses.

2. The method of claim 1, wherein the evaluating the quality of the crimp procedure comprises comparing an actual impedance of the wire with an expected impedance of the wire.

3. The method of claim 2, wherein the expected impedance is predetermined data that is retrieved from a datastore.

4. The method of claim 1, wherein the generating reporting data comprises generating graphical data that indicates a status of the evaluating.

5. The method of claim 1, wherein the generating reporting data comprises generating textual data that indicates a status of the evaluating.

6. The method of claim 1, further comprising determining a distance to a fault of the single wire based on the reflected pulses.

7. The method of claim 6, wherein the generating the reporting data comprises generating reporting data that graphically represents the distance with respect to the single wire.

8. The method of claim 6, wherein the generating the reporting data comprises generating reporting data that textually represents the distance with respect to the single wire.

9. A system for evaluating a crimp procedure of a wire in a manufacturing process, the system comprising:
    a crimp apparatus that includes a wire tray that holds the wire; and
    a crimp quality measurement module that couples to the wire tray and that evaluates a quality of a crimp procedure performed on a single wire by the crimp apparatus, and that generates reporting data based on the evaluation, wherein the evaluation is based on time-domain reflectomertry.

10. The system of claim 9, wherein the crimp quality measurement module evaluates the quality of the crimp procedure by generating test pulses, receiving reflected pulses based on the test pulses, and evaluating the reflected pulses.

11. The system of claim 9, wherein the crimp quality measurement module evaluates the quality of the crimp procedure by comparing an actual impedance of the wire with an expected impedance of the wire.

12. The system of claim 9, wherein the expected impedance is predetermined data that is retrieved from a datastore.

13. The system of claim 9, wherein the reporting data includes at least one of graphical data and textual data that indicates a status of the evaluation.

14. The system of claim 9, wherein the crimp quality measurement module determines a distance to a fault of the single wire based on the reflected pulses.

15. The system of claim 14, wherein the reporting data includes textual data that represents the distance with respect to the single wire.

16. The system of claim 14, wherein the reporting data includes graphical data that represents the distance with respect to the single wire.

* * * * *